(12) United States Patent
Cho et al.

(10) Patent No.: US 10,455,687 B2
(45) Date of Patent: Oct. 22, 2019

(54) CIRCUIT BOARD FOR POWER SUPPLY, ELECTRONIC APPARATUS INCLUDING THE SAME, AND INDUCTOR DEVICE

(71) Applicant: SAMSUNG ELECTRONICS CO., LTD., Suwon-si (KR)

(72) Inventors: Dae-woong Cho, Hwaseong-si (KR); Dong-keun Kim, Suwon-si (KR); Sung-woo Kim, Gwangmyeong-si (KR); Hyeong-gwon Kim, Ansan-si (KR); Ji-hoon Park, Namyangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/230,596

(22) Filed: Aug. 8, 2016

(65) Prior Publication Data
US 2017/0094780 A1 Mar. 30, 2017

(30) Foreign Application Priority Data
Sep. 30, 2015 (KR) .......................... 10-2015-0137992

(51) Int. Cl.
*H05K 1/02* (2006.01)
*H05K 1/11* (2006.01)
(Continued)

(52) U.S. Cl.
CPC .......... *H05K 1/0216* (2013.01); *H01F 17/02* (2013.01); *H01F 27/2804* (2013.01);
(Continued)

(58) Field of Classification Search
CPC ................. H05K 1/0216; H05K 1/181; H05K 2201/1003; H05K 1/0298; H05K 1/111;
(Continued)

(56) References Cited

U.S. PATENT DOCUMENTS 6,633,219 B2 * 10/2003 Marbach ................. H01F 17/02
336/177
7,543,956 B2 6/2009 Piepgras et al.
(Continued)

FOREIGN PATENT DOCUMENTS

JP 11-054327 A 2/1999
JP 2002-185091 A 6/2002
(Continued)

OTHER PUBLICATIONS

International Search Report dated Nov. 17, 2016 issued by International Searching Authority in International Application No. PCT/KR2016/008687 (PCT/ISA/210).
(Continued)

*Primary Examiner* — Ishwarbhai B Patel
(74) *Attorney, Agent, or Firm* — Sughrue Mion, PLLC

(57) ABSTRACT

A circuit board for a power supply, an electronic apparatus including the same, and an inductor device are provided. The circuit board includes a first pattern arranged on a first layer of the circuit board and including a first terminal coupled to a coil, a first layer region arranged on the first layer, the coil being disposed on the first layer region, and a second pattern arranged on a second layer of the circuit board, below the first layer. The second pattern includes a first blank region located below the first layer region, and has no conductive material arranged thereon.

13 Claims, 13 Drawing Sheets

(51) Int. Cl.
*H05K 1/18* (2006.01)
*H01F 27/28* (2006.01)
*H01F 27/29* (2006.01)
*H01F 17/02* (2006.01)
*H01F 27/32* (2006.01)

(52) U.S. Cl.
CPC ..... *H01F 27/2823* (2013.01); *H01F 27/2828* (2013.01); *H01F 27/292* (2013.01); *H05K 1/0225* (2013.01); *H05K 1/0298* (2013.01); *H05K 1/181* (2013.01); *H01F 27/324* (2013.01); *H01F 2027/2809* (2013.01); *H05K 1/111* (2013.01); *H05K 2201/049* (2013.01); *H05K 2201/1003* (2013.01); *H05K 2201/10265* (2013.01)

(58) Field of Classification Search
CPC ........... H01F 2027/2809; H01F 27/292; H01F 27/2804
See application file for complete search history.

(56) References Cited

U.S. PATENT DOCUMENTS

| | | | |
|---|---|---|---|
| 7,839,346 B2 | 11/2010 | Bittar et al. | |
| 8,040,291 B2 | 10/2011 | Yang et al. | |
| 8,169,185 B2 | 5/2012 | Partovi et al. | |
| 8,644,029 B1 * | 2/2014 | Ji | H05K 3/3415 361/763 |
| 8,960,557 B2 * | 2/2015 | Kato | G06K 19/07749 235/492 |
| 9,640,970 B2 * | 5/2017 | Fluhrer | H01Q 1/50 |
| 2003/0076211 A1 | 4/2003 | Matsuta et al. | |
| 2004/0042141 A1 | 3/2004 | Mikolajczak et al. | |
| 2005/0285707 A1 * | 12/2005 | Furuya | H01F 27/027 336/208 |
| 2009/0263140 A1 | 10/2009 | Kagaya | |
| 2014/0002209 A1 | 1/2014 | Ono | |
| 2014/0176278 A1 * | 6/2014 | Lee | H01F 27/2828 336/192 |
| 2014/0225698 A1 | 8/2014 | Swirhun et al. | |
| 2014/0292462 A1 | 10/2014 | Lee | |
| 2015/0068299 A1 | 3/2015 | Zhu et al. | |
| 2015/0122896 A1 | 5/2015 | Kato et al. | |

FOREIGN PATENT DOCUMENTS

| | | |
|---|---|---|
| JP | 3724405 B2 | 12/2005 |
| KR | 10-1376584 B1 | 3/2014 |
| WO | 2013/137044 A1 | 9/2013 |

OTHER PUBLICATIONS

Written Opinion dated Nov. 17, 2016 issued by International Searching Authority in International Application No. PCT/KR2016/008687 (PCT/ISA/237).
Communication dated May 4, 2018, issued by the European Patent Office in counterpart European application No. 16851990.8.
Communication dated Aug. 8, 2018, issued by the European Patent Office in counterpart European Application No. 16851990.8.
Communication dated Feb. 6, 2019 issued by the European Patent Office in counterpart European Application No. 16 851 990.8.

* cited by examiner

CIRCUIT BOARD FOR POWER SUPPLY, ELECTRONIC APPARATUS INCLUDING THE SAME, AND INDUCTOR DEVICE

CROSS-REFERENCE TO RELATED APPLICATION

This application claims priority from Korean Patent Application No. 10-2015-0137992, filed on Sep. 30, 2015, in the Korean Intellectual Property Office, the disclosure of which is incorporated herein by reference in its entirety.

BACKGROUND

Field

Apparatuses and methods consistent with exemplary embodiments relate to a circuit board for a power supply, an electronic apparatus including the same, and an inductor device, and more particularly, to a circuit board for a power supply capable of reducing common mode noise generated in a coil, an electronic apparatus including the same, and an inductor device capable of reducing common mode noise generated in a coil.

Description of Related Art

Electrical, electronic, and communication apparatuses have to meet various electromagnetic interference (EMI) standards. In the related art, common mode noise, such as EMI noise which is generated after a coil in a switching device, such as a DC-DC convertor, may be reduced using a bead or a capacitor.

The switching device or a coil may be disposed as far away as possible from a ground pattern by designing a printed circuit board (PCB) to have a large thickness, and thus the common mode noise transferred through the ground may be reduced.

However, this leads to an increased production cost because additional components, such as a bead or a capacitor, are necessary, and high-priced thick PCB is used.

SUMMARY

Exemplary embodiments may overcome the above disadvantages and other disadvantages not described above. Also, an exemplary embodiment is not required to overcome the disadvantages described above, and an exemplary embodiment may not overcome any of the problems described above.

One or more exemplary embodiments relate to a circuit board for a power supply capable of reducing common mode noise generated in a coil, an electronic apparatus including the same, and an inductor device.

According to an aspect of an exemplary embodiment, there is provided a circuit board for a power supply, the circuit board including: a first pattern arranged on a first layer of the circuit board and comprising a first terminal coupled to a coil; a first layer region arranged on the first layer, the coil being disposed on the first layer region; and a second pattern arranged on a second layer of the circuit board, below the first layer, the second pattern including a first blank region located below the first layer region, and having no conductive material arranged thereon.

The first layer region may include a first terminal coupled to a first end of the coil, a second terminal coupled to a second end of the coil, and a second blank region having no conductive material arranged thereon.

The first terminal and the second terminal may protrude in a direction corresponding to a winding direction of the coil.

The first terminal may include: a first solder pad coupled to the first pattern and the first terminal of the coil; and a first extension pattern coupled to the first solder pad and protruding in a direction perpendicular to a first arrangement direction of the first solder pad, and the second terminal may include: a second solder pad coupled to a second pattern and the second terminal of the coil; and a second extension pattern coupled to the second solder pad and protruding in a direction perpendicular to a second arrangement direction of the second solder pad.

The first extension pattern may include a first bend corresponding to the winding direction of the coil, and the second extension pattern may include a second bend corresponding to the winding direction of the coil.

The extension pattern may be configured to reduce normal mode noise of the coil.

The circuit board may be a two-sided circuit board, the first layer may be disposed on an upper surface of the two-sided circuit board, and the second layer may be disposed on a lower surface of the two-sided circuit board.

The circuit board may be a multi-layered circuit board, a ground layer may be disposed on a middle of the circuit board, and the second layer may be the ground layer.

According to an aspect of another exemplary embodiment, there is provided an electronic apparatus including: a power supply comprising a coil; and a circuit board including: a first layer including a first pattern; a first layer region arranged on the first layer, the coil being disposed on the first layer region; and a second layer including a second pattern, the second pattern including a blank region located below the first layer region, and having no conductive material arranged thereon.

The first layer region may include a first terminal coupled to a first end of the coil, a second terminal coupled to a second end of the coil, and a second blank region having no conductive material arranged thereon.

The first terminal and the second terminal may protrude in a direction corresponding to a winding direction of the coil.

The first terminal may include: a first solder pad coupled to the first pattern and the first terminal of the coil; and a first extension pattern coupled to the first solder pad and protruding in a direction perpendicular to a first arrangement direction of the first solder pad, and the second terminal may include: a second solder pad coupled to a second pattern and the second terminal of the coil; and a second extension pattern coupled to the second solder pad and protruding in a direction perpendicular to a second arrangement direction of the second solder pad.

The first extension pattern may include a first bend corresponding to the winding direction of the coil, and the second extension pattern may include a second bend corresponding to the winding direction of the coil.

According to an aspect of still another exemplary embodiment, there is provided an inductor device including: a conductive wire wound a plurality of times in a winding direction; a first terminal coupled to a first end of the conductive wire and a first solder pad of a circuit board; and a second terminal coupled to a second end of the conductive wire and a second solder pad of the circuit board, wherein the first terminal protrudes in a first direction perpendicular to an arrangement direction of the first solder pad, and the second terminal protrudes in a second direction perpendicular to an arrangement direction of the second solder pad.

The first terminal may include a first bend corresponding to the winding direction, and the second terminal may include a second bend corresponding to the winding direction.

According to an aspect of still another exemplary embodiment, there is provided a circuit board for a power supply, the circuit board including: a first layer comprising a coil arrangement region, a first pattern, a first terminal, a second pattern and a second terminal; and a second layer below the first layer and comprising a blank region having no conductive material arranged thereon.

The first terminal may be on a first side of the coil arrangement region, and the second terminal may be on a second side of the coil arrangement region.

The first terminal may include a first extension pattern extending along the first side and a third side of the coil arrangement region, and the second terminal may include a second extension pattern extending along the second side and a fourth side of the coil arrangement region.

The second layer may include a third pattern and a fourth pattern, the blank region may correspond to the coil arrangement region, the first pattern may correspond to the third pattern, and the second pattern may correspond to the fourth pattern.

The circuit board may further include a coil arranged on the coil arrangement region, and connected to the first terminal and the second terminal.

Additional aspects and advantages of the exemplary embodiments are set forth in the detailed description, and will be obvious from the detailed description, or may be learned by practicing the exemplary embodiments.

BRIEF DESCRIPTION OF THE DRAWINGS

The above and/or other aspects will be more apparent by describing certain exemplary embodiments with reference to the accompanying drawings, in which.

DETAILED DESCRIPTION OF EXEMPLARY EMBODIMENTS

Figure 1:
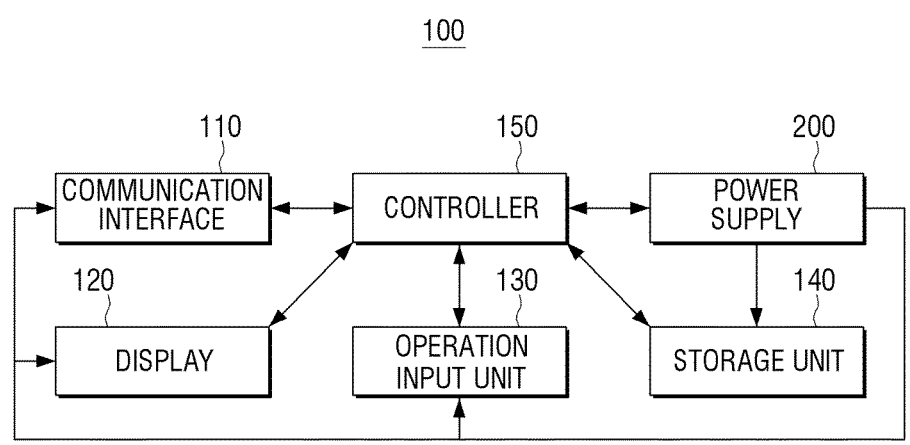
FIG. 1 is a block diagram illustrating a configuration of an electronic apparatus according to an exemplary embodiment.

Exemplary embodiments may be diversely modified. Accordingly, specific exemplary embodiments are illustrated in the drawings and are described in detail. However, it is to be understood that the present disclosure is not limited to the specific exemplary embodiments described herein, but includes all modifications, equivalents, and substitutions without departing from the scope and spirit of the present disclosure. Also, well-known functions or constructions are not described in detail because they would obscure the disclosure with unnecessary detail.

The terms "first", "second", etc., may be used to describe diverse components, but the components are not limited by the terms. The terms are only used to distinguish one component from another.

The terms used in the present application are used to describe exemplary embodiments, and are not intended to limit the scope of the disclosure. The singular expression also includes the plural meaning as long as it does not differently mean in the context. In the present application, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

In the exemplary embodiment, a "module" or a "unit" performs at least one function or operation, and may be implemented with hardware, software, or a combination of hardware and software. In addition, a plurality of "modules" or a plurality of "units" may be integrated into at least one module, except for a "module" or a "unit" which has to be implemented with specific hardware, and may be implemented with at least one processor.

Hereinafter, exemplary embodiments will be described in detail with reference to the accompanying drawings.

FIG. 1 is a block diagram illustrating a configuration of an electronic apparatus according to an exemplary embodiment.

Referring to FIG. 1, an electronic apparatus 100 according to an exemplary embodiment may include a communication interface 110, a display 120, an operation input unit 130, a storage unit 140, a controller 150, and a power supply 200. The electronic apparatus 100 may be a display apparatus, such as a monitor or a television (TV), a set-top box, an audio device, a personal computer (PC), and the like, in which a power supply is built.

The communication interface 110 may be formed to couple the electronic apparatus 100 to an external apparatus. The communication interface 110 may be coupled to the external apparatus through a local area network (LAN) and an Internet network. The communication interface 110 may be coupled to the external apparatus through a wireless communication connection (for example, global system for mobile communication (GSM), universal mobile telephone system (UMTS), long term evolution (LTE), and wireless broadband Internet (WiBro)).

The display 120 may display a variety of information provided from the electronic apparatus 100. The display 120 may be implemented with an apparatus which displays an image, such as a cathode-ray tube (CRT), a liquid crystal display (LCD), an organic light emitting diode (OLED) display, and an active matrix OLED (AMOLED) display. The display 120 may be implemented with a touch screen which may also perform a function of the operation input unit 130 to be described later.

The operation input unit 130 may include a plurality of function keys which the user may set or select various functions supported in the electronic apparatus 100 therethrough. The operation input unit 130 may receive various commands from the user. The operation input unit 130 may be implemented with an input device, such as a keyboard, a mouse, a touch pad or a button, or may be implemented with a touch screen which may also perform the function of the display 120.

The storage unit 140 may be a memory device which stores program code and data in the controller 150 while the electronic apparatus 100 operates. The storage unit 140 may read data from, and write data in a memory region through direct access by a command of a central processing unit (CPU).

The storage unit 140 may store program code for driving of the electronic apparatus 100. For example, the storage unit 140 may store the program code which is a set of various commands required for driving the electronic apparatus 100. The storage unit 140 may be a read only memory (ROM), a hard disc drive (HDD), a solid state disc (or a solid state drive) (SSD), or the like.

The controller 150 may control the configuration of the electronic apparatus 100. For example, in response to the power being supplied based on input of a turn-on command, the controller 150 may boot the system using an operating system (O/S) stored in the storage unit 140 according to a command stored in a ROM therein. In response to the booting being completed, the controller 150 may perform an operation (or service) corresponding to the input user command through the display 120. The controller 150 may control the display 120 to display a screen according to an operation result.

The power supply 200 may supply power to the components of the electronic apparatus 100 using power provided from the outside or power stored in a battery. For example, the power supply 200 may include a DC-DC converter, an inductor, and the like, generate the power required in the electronic apparatus 100, and provide the generated power to the components in the electronic apparatus 100. The power supply 200 may be disposed on a circuit board.

When a switching device (for example, a DC-DC converter) and a coil are disposed on the circuit board, the common mode noise may be generated through a ground pattern between the switching device and winding of the coil.

The common mode noise may be called in-phase noise, and may refer to in-phase noise generated between each line of an anode and a ground through current which flows from the circuit to the ground through stray capacitance between the switching device and the coil or between windings of a transformer.

To reduce the common mode noise in the exemplary embodiment, a circuit board having a blank region, in which a conductive material is not arranged on a layer below a region in which the coil is located, may be used. The circuit board will be described with reference to FIGS. 2 to 9.

As described above, the electronic apparatus according to the exemplary embodiment may reduce the common mode noise generated in the power supply (for example, inductor) using a circuit board having a blank region without separate parts. The circuit board may be implemented by peeling only a partial conductive region without an increase in the thickness of the circuit board, and thus the cost-saving effect may be obtained.

Figure 2:
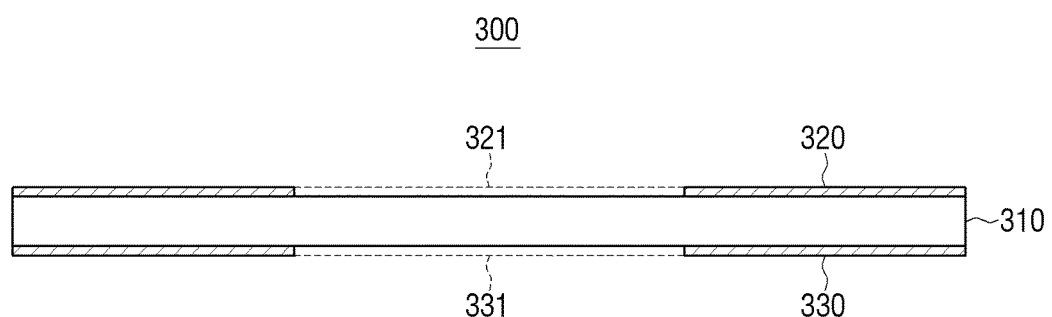
FIG. 2 is a diagram illustrating a structure of a circuit board for a power supply according to an exemplary embodiment.

FIG. 2 is a diagram illustrating a structure of a circuit board for a power supply according to an exemplary embodiment.

Referring to FIG. 2, a circuit board 300 for a power supply (hereinafter, referred to as a circuit board) according to an exemplary embodiment may include a body unit 310, a first pattern 320, and a second pattern 330.

The body unit 310 may be a board having a preset form, and may be formed of a material such as plastic. The body unit 310 may be formed of a flexible material, and may be flexible.

The first pattern 320 may be arranged on a first layer which is an upper surface of the circuit board. For example, the first pattern 320 may be a pattern arranged on the upper surface of the circuit board in which components of the power supply are disposed and configured to electrically couple the components of the power supply.

The first pattern 320 may include a coil arrangement region 321 in which the coil is disposed. The coil arrangement region 321 includes a first terminal coupled to one end of the coil, a second terminal coupled to the other end of the coil, and a second blank region in which a conductive material is not arranged. The coil arrangement region 321 may have various layouts, and the various layouts of the coil arrangement region 321 will be described later with reference to FIGS. 4 and 7 to 9.

The second pattern 330 may be arranged on a second layer below the first layer. The second pattern 330 may be electrically coupled to a ground terminal of the power supply. For example, when the circuit board is a two-sided circuit board, the second pattern 330 may be arranged on a lower surface of the two-sided circuit board. In another example, when the circuit board is a multi-layered circuit board, the second pattern may be arranged on a ground layer among a plurality of layers. In this example, the ground layer may be disposed in an intermediate surface of the body unit 310 or may be disposed in a lower surface of the body unit 310.

The second pattern 330 may include a blank region 331. The blank region may be a region in which a conductive material is not arranged and may be a partial region on the second layer corresponding to the first layer region in which the coil is disposed (for example, the coil arrangement region 321) below the first layer region.

As described above, the circuit board 300 according to the exemplary embodiment may reduce common mode noise which may be generated in the power supply (for example, inductor) using the blank region without separate additional parts.

Although FIG. 2 illustrates that one coil arrangement region and one blank region are arranged on the circuit board, this is exemplary. When a plurality of coils are disposed on the circuit board, a plurality of coil arrangement regions and a plurality of blank regions may be provided on the circuit board.

Although it has been illustrated in FIG. 2 that the circuit board includes the body unit, the first pattern, and the second pattern, this is exemplary, and an insulating material for insulation may be coated on the first pattern and the second pattern.

Although it has been described that the circuit board is applied to only the power supply, this is exemplary, and the circuit board may be applied to any apparatus having a region in which the common mode noise may be generated other than the power supply.

Figure 3:
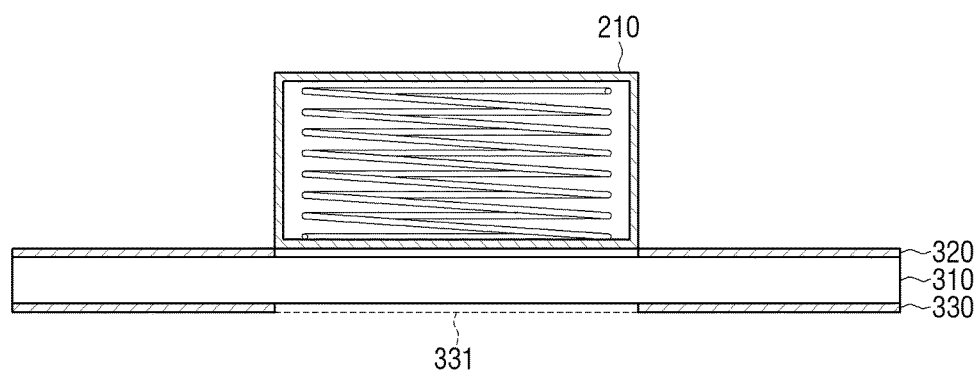
FIG. 3 is a diagram illustrating an arrangement of a coil and a circuit board for a power supply according to an exemplary embodiment.

FIG. 3 is a diagram illustrating an arrangement form of a coil and a circuit board for a power supply.

Referring to FIG. 3, the first pattern 320 may be arranged on a top of the body unit 310, and the second pattern 330 may be arranged on a bottom of the body unit 310.

The coil 210 may be disposed in the coil arrangement region 321 on the first layer of the circuit board 300. The coil 210 may be an inductor device, a transformer, or any device having stray capacitance.

The blank region 331 may be arranged on the second layer below the coil arrangement region 321 in which the coil 210 is disposed. The blank region 331 may have a size corresponding to a size of the coil.

Since the grounded conductive material is not arranged below the coil 210, the common mode noise generated in the coil 210 may be reduced. The noise reduction effect will be described in detail later with reference to FIGS. 12 and 13.

For example, the blank region 331 may be implemented in a process of forming the second pattern on the circuit board, that is, in a process of forming the ground layer by depositing no conductive material on the blank region. In another example, the blank region 331 may be formed by depositing a conductive material on the entire ground layer and removing the deposited conductive material from the blank region.

Although it has been illustrated in the example of FIG. 3 that the coil which is wound several times in a direction perpendicular to the circuit board is disposed, this is exemplary, and a circuit board in which a coil which is wound several times in a direction parallel with the circuit board is disposed may be implemented. The example of the circuit board will be described later with reference to FIG. 9.

Figure 4A:
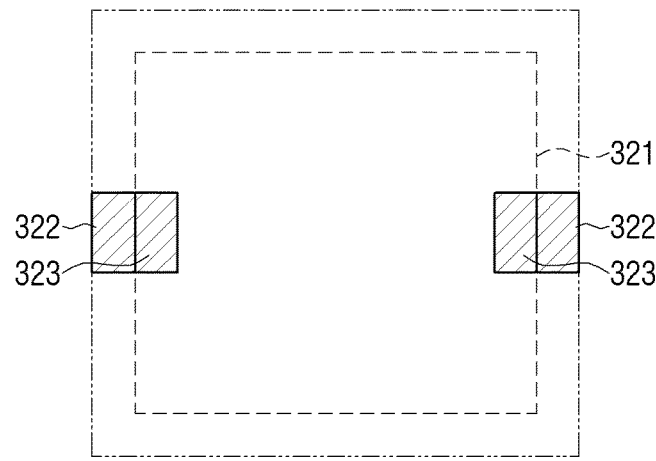
FIGS. 4A and 4B are diagrams illustrating an upper surface and a lower surface of a circuit board according to a first exemplary embodiment.
Figure 4B:
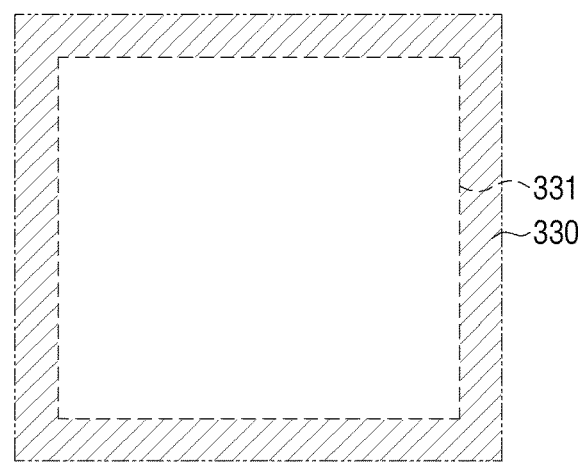

FIGS. 4A and 4B are diagrams illustrating an upper surface and a lower surface of a circuit board according to a first exemplary embodiment. For example, FIG. 4A is a diagram illustrating the upper surface of the circuit board 300 (that is, layout of the first pattern), and FIG. 4B is a diagram illustrating the lower surface of the circuit board 300 (that is, layout of the second pattern).

Referring to FIG. 4A, a terminal 323 may be disposed in the coil arrangement region 321 in which the coil is disposed. The terminal 323 may be a conductive terminal which is to be coupled to the terminal of the coil, that is, a solder pad. The solder pad 323 may be coupled to a wiring pattern 322 which is to be coupled to other device. The remaining region of the coil arrangement region 321 other than the terminal 323 may be the second blank region in which the conductive material is not arranged.

Referring to FIG. 4B, a region of the second layer corresponding to the coil arrangement region 321 may be the blank region 331 in which a conductive material is not arranged. The conductive material may be arranged in the remaining region of the second layer other than the blank region and may serve as a ground layer.

Figure 5:
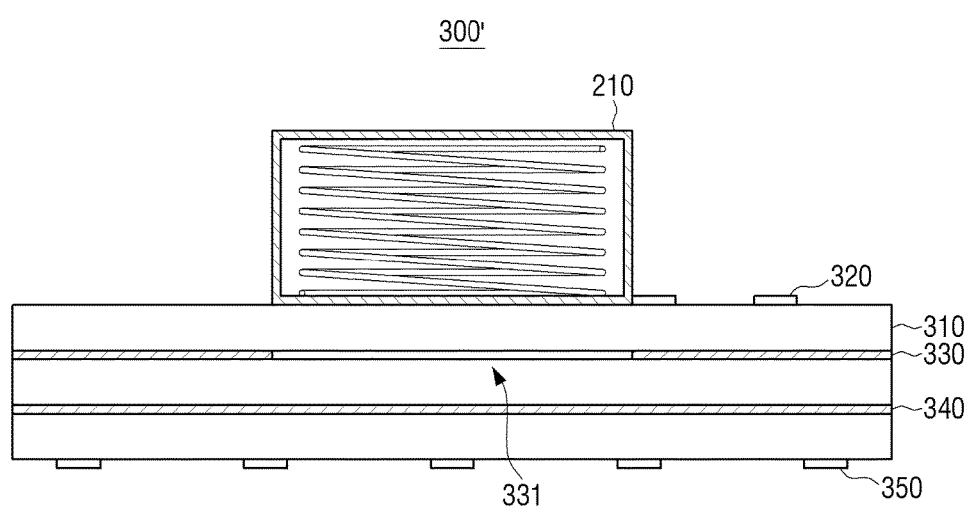
FIG. 5 is a diagram illustrating a structure of a circuit board according to a second exemplary embodiment.

FIG. 5 is a diagram illustrating a structure of a circuit board according to a second exemplary embodiment.

Referring to FIG. 5, a circuit board 300' may include a plurality of layers. For example, the plurality of layers may include a first signal layer 320, a ground layer 330, a power layer 340, and a second signal layer 350. A multi-layered circuit board having four layers has been illustrated in the exemplary embodiment, but the multi-layered circuit board may be implemented to include three layers or five layers or more.

A pattern for signal transfer between circuit components disposed on the circuit board 300' may be arranged on the first signal layer 320. The first signal layer 320 may correspond to the first layer described in FIGS. 2 and 3.

A second pattern coupled to a ground of the circuit components disposed on the circuit board 300' may be arranged on the ground layer 330. In general, the ground layer may be disposed on an entire region of the circuit board, but a blank region 331 may be arranged on the ground layer 330 corresponding to a region in which a coil 210 is disposed in the exemplary embodiment. Accordingly, the ground layer 330 may correspond to the second layer described in FIGS. 2 and 3.

A pattern for providing the power to the circuit components disposed on the circuit board 300' may be arranged on the power layer 340. In general, the power layer may be disposed in an entire region of the circuit board. Although it has been illustrated that a conductive material of the power layer 340 may be arranged even below the blank region 331 of the ground layer 330, this is exemplary, and the circuit board may be implemented in such a manner that the conductive material may not be arranged in a region of the power layer 340 corresponding to the region in which the coil 210 is disposed. That is, a blank region may be arranged even in the power layer 340 like the ground layer 330.

A pattern for signal transfer between the circuit components disposed on the circuit board 300' may be arranged on the second signal layer 350. Although it has been illustrated that the pattern is arranged on the second signal layer below the coil 210, this is exemplary, and the circuit board may be implemented in such a manner that a conductive pattern may not be arranged even in a region of the second signal layer 350 corresponding to the blank region 331.

It has been illustrated in FIGS. 2 to 5 that the blank region is arranged on the ground layer of the circuit board. When the blank region is arranged on the second layer below the coil, the effect that the electromagnetic signal of the coil affects the ground may be interrupted.

However, when the conductive material is completely removed in the blank region, the common mode noise may be reduced, but normal mode noise may not be absorbed or shielded in the pattern and may be irradiated upwardly. The normal mode noise may be called normal noise, and may refer to noise represented in an input or output line by voltage or current surge caused in a switching device and the like.

Hereinafter, a pattern shape on the first layer for reducing the normal mode noise will be described with reference to FIGS. 6 to 9. To reduce the normal mode noise, an inductor device having an improved terminal form may be used. The inductor device will be described later with reference to FIGS. 10 and 11.

Figure 6:
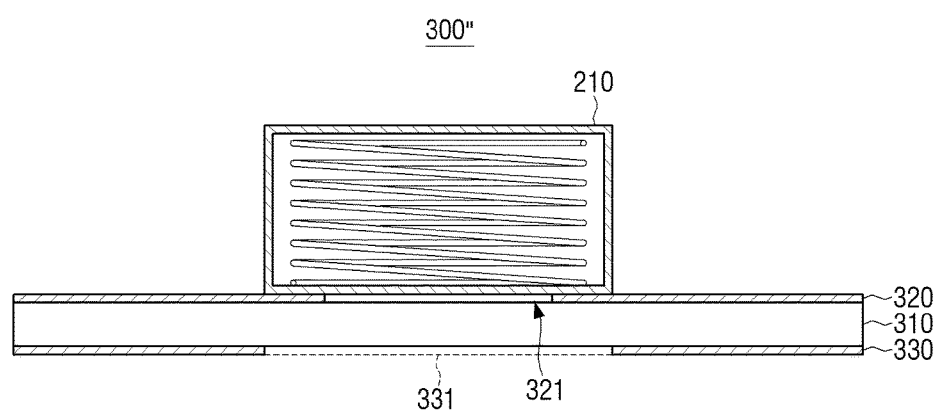
FIG. 6 is diagram illustrating a side of a circuit board according to a third exemplary embodiment.
Figure 7:
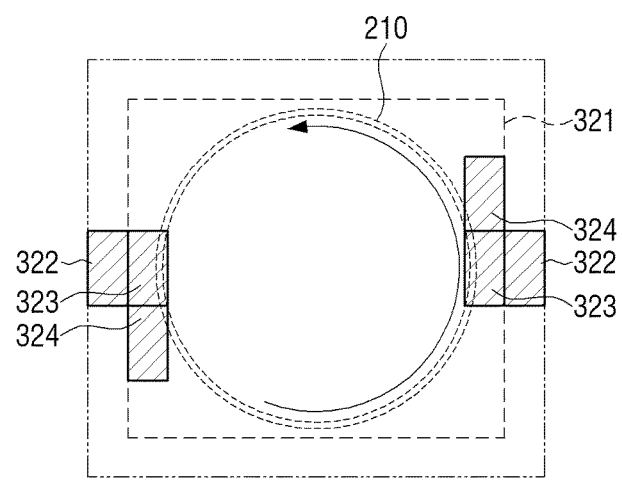
FIG. 7 is a diagram illustrating an upper surface of the circuit board according to the third exemplary embodiment.

FIG. 6 is diagram illustrating a side of a circuit board according to a third exemplary embodiment. FIG. 7 is a diagram illustrating an upper surface of the circuit board according to the third exemplary embodiment.

Referring to FIGS. 6 and 7, a circuit board 300" according to the third exemplary embodiment may include a body unit 310, a first pattern 320, and a second pattern 330.

The structure and operation of the body unit 310 and the second pattern 330 are the same as those of the body unit 310 and the second pattern 330 in FIGS. 2 and 3, and thus overlapping description thereof will be omitted.

The first pattern 320' may be arranged on a first layer which is an upper surface of the circuit board 300". For example, the first pattern 320 may have a coil arrangement region 321 in which a coil is disposed.

A first terminal coupled to one end of the coil 210, a second terminal coupled to the other end of the coil 210, and a second blank region in which a conductive material is not arranged (for example, a remaining region of the coil arrangement region 321 other than the first terminal and the second terminal) may be included in the coil arrangement region 321. That is, the first pattern 320 on the coil arrangement region 321 may have conductive patterns corresponding to the first terminal and the second terminal.

Each of the first terminal and the second terminal may include a solder pad 323 and an extension pattern 324.

A wiring pattern 322 may be a pattern for electrically coupling the coil 210 to other circuit device disposed on the circuit board 300". An insulating material for preventing a short circuit may be coated on the wiring pattern 322.

The solder pad 323 may be coupled to the wiring pattern 322 and a terminal of the coil. For example, the solder pad 323 may be a terminal which is to be physically and electrically coupled to the coil 210. The solder pad 323 may be arranged to correspond to a terminal position and a terminal shape of the coil 210 and may be a region in which a conductive material is exposed.

The extension pattern 324 may be coupled to the solder pattern 323 and may be a pattern region protruding to a direction perpendicular to an arrangement direction of two solder pads. The protruding direction may be changed according to the wining direction of the coil. For example, as illustrated in FIG. 7, when the winding direction of the coil is a counterclockwise direction, the protruding direction of the extension pattern 324 may also be a counterclockwise direction. When the winding direction of the coil being a clockwise direction, the protruding direction of the extension pattern 324 may also be a clockwise direction.

The extension pattern 324 may be a region in which a conductive material is exposed or coated according to the shape of the terminal of the coil 210 like the solder pad. For example, when a conventional inductor is disposed in the circuit board 300", the extension pattern 324 may be a region in which the conductive material may not be exposed.

Figure 10A:
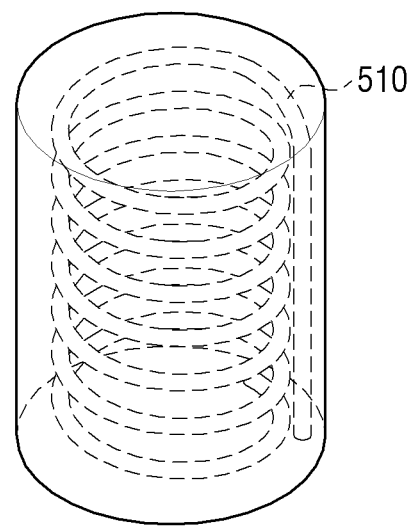
FIGS. 10A and 10B are diagrams illustrating a structure of an inductor device according to a first exemplary embodiment.
Figure 10B:
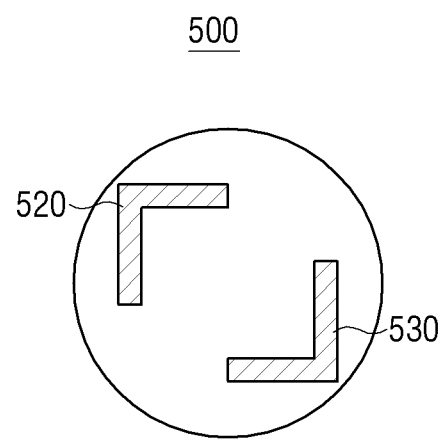
Figure 11:
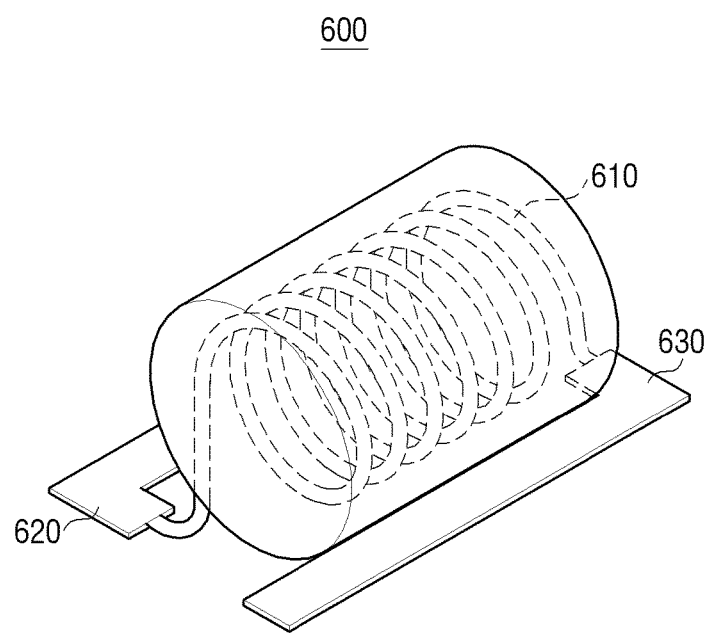
FIG. 11 is a diagram illustrating a structure of an inductor device according to a second exemplary embodiment.

When the inductor device as illustrated in FIG. 10 or 11 is disposed in the circuit board 300', a conductive material may be exposed like the solder pad. Even when the inductor device as illustrated in FIG. 10 or 11 is disposed in the circuit board 300', soldering may be performed only on the solder pad 323, and thus the conductive material may not be exposed.

Because the circuit board 300" according to the exemplary embodiment has the terminal arranged to extend to a direction corresponding to the winding direction of the coil, the normal mode noise which may be increased by the blank region may be reduced.

Although it has been illustrated that the extension pattern 324 may have a rectangular shape similar to the shape of the solder pad, this is exemplary, and the extension pattern 324 may have various shapes. For example, because the extension pattern 324 is configured to reduce the normal mode noise of the coil, the extension pattern 324 may be arranged to correspond to the wining form of the coil. The example of the extension pattern will be described later with reference to FIGS. 8 and 9.

Although it has been illustrated that because the coil is wound in a counterclockwise direction, a left extension pattern is arranged to protrude downwardly, and a right extension pattern is arranged to protrude upwardly. However, this is exemplary, and when the coil is wound in a clockwise direction, the left extension pattern may be arranged to protrude upwardly, and the right extension pattern may be arranged to protrude downwardly.

Figure 8:
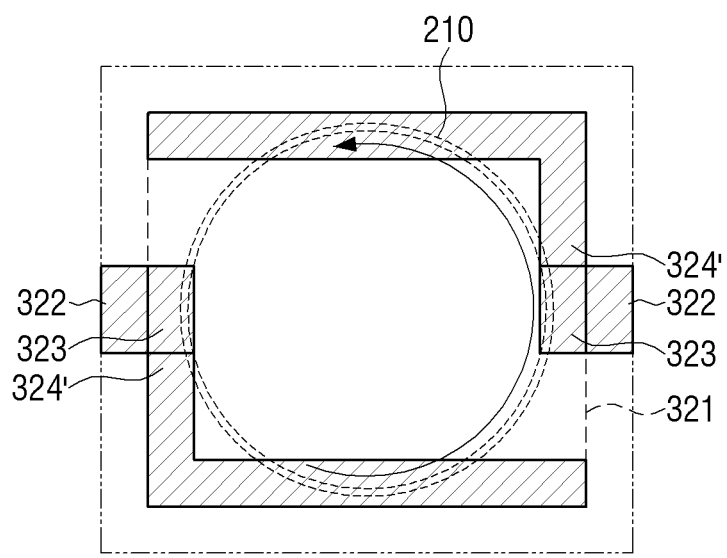
FIG. 8 is a diagram illustrating an upper surface of a circuit board according to a fourth exemplary embodiment.

FIG. 8 is a diagram illustrating an upper surface of a circuit board according to a fourth exemplary embodiment.

Referring to FIG. 8, an extension pattern 324' may be located within a coil arrangement region 321 and have a shape protruding to a direction corresponding to the winding direction of a coil 210. For example, a left extension pattern 324' may have a form which extends to a downward direction on the basis of a solder pad 323, is bent to the right, and also extends to the right. A right extension pattern 324' may have a form which extends to an upward direction on the basis of the solder pad 323, is bent to the left, and also extends to the left.

Although it has been illustrated that the extension pattern 324' has one bent portion, this is exemplary, and the extension pattern may be implemented to have a plurality of bent portions. Also, although it has been illustrated that the extension pattern is configured in a right-angled shape, this is exemplary, and the extension pattern may be implemented to have a streamlined shape to correspond to the shape of the coil.

Figure 9:
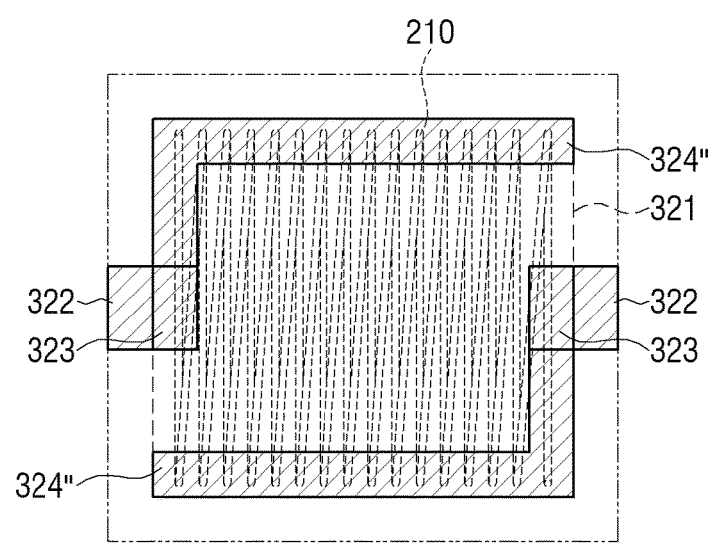
FIG. 9 is a diagram illustrating an upper surface of a circuit board according to a fifth exemplary embodiment.

FIG. 9 is a diagram illustrating an upper surface of a circuit board according to a fifth exemplary embodiment.

Referring to FIG. 9, a coil 210 may be wound in a direction parallel with a board direction (or a horizontal surface). An extension pattern 324" may be arranged within a coil arrangement region 321 to correspond to the winding direction of the coil 210. For example, a left extension pattern 324" may have a form which extends to an upward direction on the basis of a solder pad 323, is bent to the right, and also extends to the right. A right extension pattern 324" may have a form which extends to a downward direction on the basis of the solder pad 323, is bent to the left, and also extends to the left.

Although it has been illustrated that the extension pattern 324" has one bent portion, this is exemplary, and the extension pattern may be implemented to have a plurality of bent portions. Further, although it has been illustrated that the extension pattern is configured in a right-angled structure, this is exemplary and the extension pattern may be implemented to have a streamlined shape to correspond to the shape of the coil.

FIGS. 10A and 10B are diagrams illustrating a structure of an inductor device according to an exemplary embodiment. For example, FIG. 10A is a perspective view illustrating the inductor device, and FIG. 10B is a diagram illustrating a lower surface of the inductor device.

Referring to FIGS. 10A and 10B, an inductor device 500 may include a conductive wiring unit 510, a first terminal 520, and a second terminal 530.

The conductive wiring unit 510 may be a coil wound several times in a preset direction. The winding of the coil may be wound on the basis of a direction (for example, an axis direction of a body of the inductor device) perpendicular to a plane in which the first terminal 520 and the second terminal 530 are arranged.

The first terminal 520 may be coupled to one end of the conductive wiring unit and a first solder pad of the circuit board. The first terminal 520 may have a shape protruding to a direction perpendicular to an arrangement direction of the first solder pad and a second solder pad. The first terminal 520 may have a one-bend shape to correspond to the winding direction of the conductive wiring unit as illustrated in FIG. 10.

The second terminal 530 may be coupled to the other end of the conductive wiring unit and the second solder pad of the circuit board. The second terminal 530 may have a shape protruding to a direction perpendicular to the arrangement direction of the first solder pad and the second solder pad. The second terminal 530 may have a one-bend shape to correspond to the winding direction of the conductive wiring unit as illustrated in FIG. 10.

The inductor device 500 may be disposed on the circuit board 300 as illustrated in FIGS. 2 to 4. The normal mode noise which may be caused by the arrangement of the blank region in the circuit board 300 may be reduced through the terminals having the above-described shape.

The inductor device 500 may be disposed even on the circuit board as illustrated in FIG. 7 or 8.

FIG. 11 is a diagram illustrating a structure of an inductor device according to a second exemplary embodiment.

Referring to FIG. 11, an inductor device 600 may include a conductive wiring unit 610, a first terminal 620, and a second terminal 630.

The conductive wiring unit 610 may be a coil wound several times in a preset direction. The coil may be wound on the basis of a direction parallel with a plane in which the first terminal 620 and the second terminal 630 are arranged.

The first terminal 620 may be coupled to one end of the conductive wiring unit and a first solder pad of the circuit board. The first terminal 620 may have a shape protruding to a direction perpendicular to an arrangement direction of the first solder pad and a second solder pad. For example, the first terminal 620 may have a one-bend shape to correspond to the winding direction of the conductive wiring unit as illustrated in FIG. 11.

The second terminal 630 may be coupled to the other end of the conductive wiring unit and the second solder pad of the circuit board. The second terminal 630 may have a shape protruding to a direction perpendicular to the arrangement direction of the first solder pad and the second solder pad. The second terminal 630 may have a one-bend shape to correspond to the winding direction of the conductive wiring unit as illustrated in FIG. 11.

The inductor device 600 may be disposed on the circuit board 300 as illustrated in FIGS. 2 to 4. The normal mode noise which may be caused by the arrangement of the blank region in the circuit board 300 may be reduced through the terminals having the above-described shapes.

The inductor device 600 may be disposed even on the circuit board as illustrated in FIG. 7 or 8.

Figure 12:
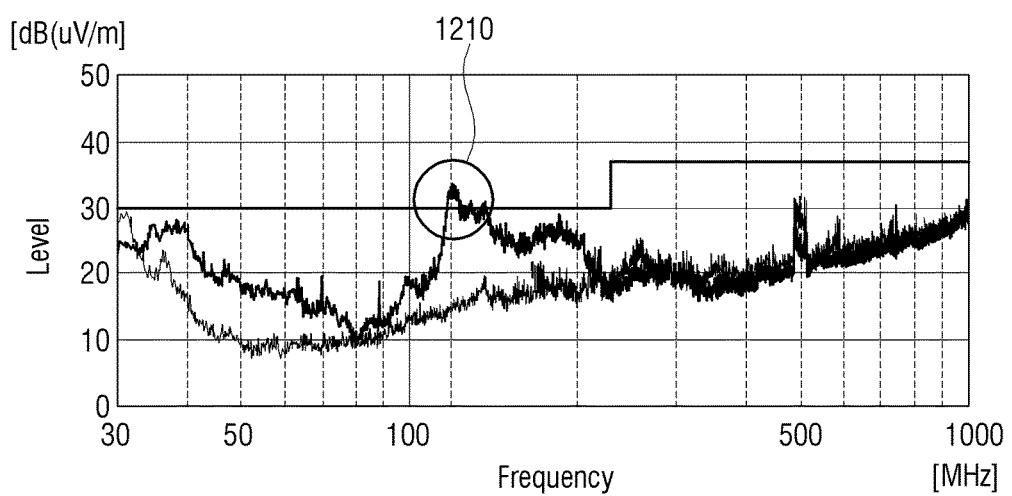
FIGS. 12 and 13 are waveform diagrams illustrating an EMI noise removal effect according to an exemplary embodiment.
Figure 13:
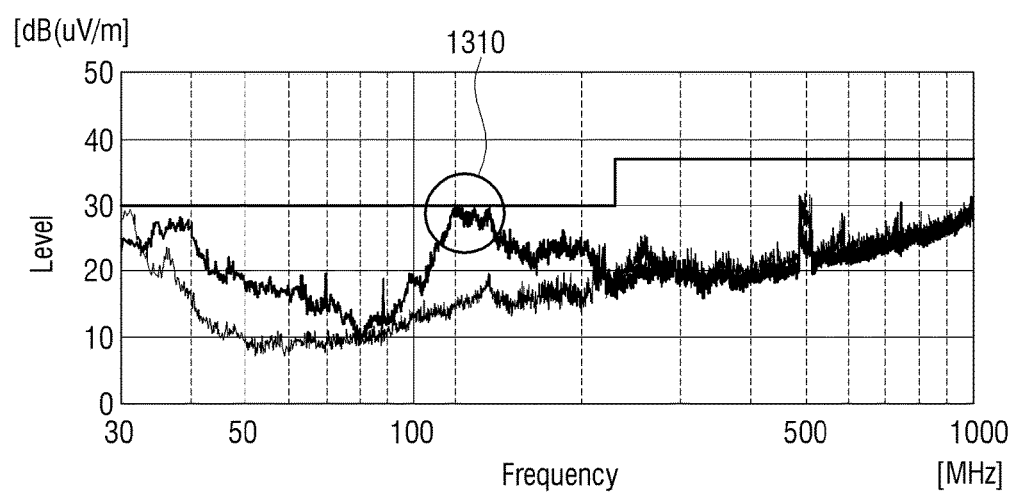

FIGS. 12 and 13 are waveform diagrams illustrating an EMI noise removal effect according to an exemplary embodiment. For example, FIG. 12 is a diagram illustrating an EMI characteristic when a circuit board in the related art is used, and FIG. 13 is a diagram illustrating an EMI characteristic when the circuit board according to the first exemplary embodiment is used.

Referring to FIGS. 12 and 13, it can be seen that the EMI radiation noise is generated in a 110 MHz region (see 1210) when the circuit board in the related art being used, but noise is reduced by 4 to 5 dB and the EMI radiation criterion in the 110 MHz region (see 1310) is met when the circuit board according to the exemplary embodiments is used.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A circuit board capable of coupling a coil for a power supply, the circuit board comprising:
   a first pattern comprising a first terminal coupled to the coil, the first pattern arranged on a first layer of the circuit board;
   a first layer region arranged on the first layer, the coil being disposed on the first layer region by coupling to the first terminal;
   a second pattern comprising a second terminal electrically isolated from the coupled coil, the second pattern arranged on a second layer of the circuit board below the first layer; and
   a second layer region arranged on the second layer, the second layer region having no conductive material directly below the coupled coil,
   wherein a size of the second layer region matches a size of the first layer region.

2. The circuit board as claimed in claim 1, wherein the first terminal is coupled to a first end of the coil, and
   wherein the first layer region further comprises a second terminal coupled to a second end of the coil, and a blank region having no conductive material arranged thereon.

3. The circuit board as claimed in claim 2, wherein the first terminal and the second terminal protrude in a first direction corresponding to a winding direction of the coil.

4. The circuit board as claimed in claim 1, wherein the first layer region further comprises a second terminal coupled to a second end of the coil, and
   wherein the first terminal comprises:
      a first solder pad coupled to the first pattern and the first terminal of the coil; and
      a first extension pattern coupled to the first solder pad and protruding in a second direction perpendicular to a first direction, and
   wherein the second terminal comprises:
      a second solder pad coupled to a second pattern and the second terminal of the coil; and
      a second extension pattern coupled to the second solder pad and protruding in parallel to the second direction.

5. The circuit board as claimed in claim 4, wherein the first extension pattern comprises a first ninety-degree bend corresponding to a winding direction of the coil, and
   wherein the second extension pattern comprises a second ninety-degree bend corresponding to the winding direction of the coil.

6. The circuit board as claimed in claim 4, wherein the first extension pattern is configured to reduce normal mode noise of the coil.

7. The circuit board as claimed in claim 1, wherein the circuit board is a two-sided circuit board,
   wherein the first layer is disposed on an upper surface of the two-sided circuit board, and
   wherein the second layer is disposed on a lower surface of the two-sided circuit board.

8. The circuit board as claimed in claim 1, wherein the circuit board is a multi-layered circuit board,
   a ground layer is disposed on a middle of the circuit board, and
   the second layer is the ground layer.

9. A power supply apparatus comprising:
   a coil; and
   a circuit board capable of coupling the coil comprising:
      a first pattern comprising a first terminal coupled to the coil, the first pattern arranged on a first layer of the circuit board;
      a first layer region arranged on the first layer, the coil being disposed on the first layer region by coupling to the first terminal; and
      a second pattern comprising a second terminal electrically isolated from the coupled coil, the second pattern arranged on a second layer of the circuit board below the first layer; and a second layer region arranged on the second layer, the second layer region having no conductive material directly below the coupled coil, wherein a size of the second layer region matches a size of the first layer region.

10. The power supply apparatus as claimed in claim 9, wherein the first layer region comprises a second terminal coupled to a second end of the coil, and a blank region having no conductive material arranged thereon.

11. The power supply apparatus as claimed in claim 10, wherein the first terminal and the second terminal protrude in a first direction corresponding to a winding direction of the coil.

12. The power supply apparatus as claimed in claim 11, wherein the first terminal comprises:
- a first solder pad coupled to the first pattern and the first terminal of the coil; and
- a first extension pattern coupled to the first solder pad and protruding in a second direction perpendicular to the first direction, and wherein the second terminal comprises:
- a second solder pad coupled to a second pattern and the second terminal of the coil; and
- a second extension pattern coupled to the second solder pad and protruding parallel to the second direction.

13. The power supply apparatus as claimed in claim 12, wherein the first extension pattern comprises a first ninety-degree bend corresponding to the winding direction of the coil, and the second extension pattern comprises a second ninety-degree bend corresponding to the winding direction of the coil.

* * * * *